United States Patent

Miura et al.

[11] 4,267,260
[45] May 12, 1981

[54] DEVELOPER FOR LITHOGRAPHIC PRINTING PLATE

[75] Inventors: Konoe Miura; Chihiro Eguchi, both of Yokohama; Yoshihiro Takahashi, Tokyo; Akinobu Oshima, Kawasaki; Kazuo Torige; Shinichi Bunya, both of Yokohama, all of Japan

[73] Assignee: Mitsubishi Chemical Industries, Ltd., Tokyo, Japan

[21] Appl. No.: 706,600

[22] Filed: Jul. 19, 1976

[30] Foreign Application Priority Data

Jul. 31, 1975 [JP] Japan .................................. 50-93467

[51] Int. Cl.$^3$ ........................... G03C 5/24; G03F 7/02
[52] U.S. Cl. ..................................... 430/302; 430/325; 430/331; 430/309; 134/38
[58] Field of Search ...................... 252/364; 96/35.1; 134/38; 430/309, 325, 331

[56] References Cited

U.S. PATENT DOCUMENTS

| | | | |
|---|---|---|---|
| 2,670,286 | 2/1954 | Minsk et al. | 230/287 |
| 2,791,504 | 5/1957 | Plambeck, Jr. | 96/35.1 |
| 3,796,602 | 3/1974 | Briney et al. | 252/364 X |

OTHER PUBLICATIONS

*Cellosolve and Carbitol* Solvents, Union Carbide Chemicals, (1962), pp. 8, 10, 12, (copy in 166–Albrecht).
Condensed Chemical Dictionary, Sixth Edition, p. 741, published 1961 by Reinhold Publishing Corp., New York.

*Primary Examiner*—John D. Welsh
*Attorney, Agent, or Firm*—Oblon, Fisher, Spivak, McClelland & Maier

[57] ABSTRACT

A developer for use with a lithographic photo-sensitive medium of a polyether resin, comprising a compound of the formula:

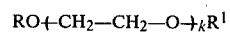

or

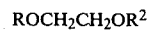

(wherein R represents an alkyl group with carbon number of 1 to 4, $R^1$ represents hydrogen or an acyl group, $R^2$ represents an acyl group with a carbon number of 2 to 5, and k represents an integer of 2 to 3).

6 Claims, No Drawings

DEVELOPER FOR LITHOGRAPHIC PRINTING PLATE

BACKGROUND OF THE INVENTION

1. Field of the Invention

The present invention relates to a developer for use with a lithographic printing plate, and more particularly to a developer for a lithographic printing plate having a colored coating film of a negative photosensitive polymer.

2. Description of the Prior Art

Heretofore, various types of composites or mixtures have been employed as photosensitive media for negative lithographic printing, such as for example a composite prepared by mixing ammonium bichromate with albumen, gum arabic, polyvinyl alcohol or the like, a composite consisting of a diazonium salt and formaldehyde or a mixture of a diazo compound and a resin (such as novolak resin) soluble in an aqueous alkali, solution. These conventional types of photosensitive media, however, are usually not very hydrophobic and hence the affinity between the media and printing ink is is poor. Consequently, it is necessary to supply extra ink to improve fat sensitivity during manufacture of the plates. Also, since these types of sensitive materials generally possess low molecular weight, they often prove to be unable to provide sufficient image strength on a plate after exposure and development. In other words, their so-called printing resistance is poor.

An increasingly popular solution to these problems has been the, use of so-called photosensitive polymers as photosensitive materials for lithographic printing. Generally, these photosensitive polymers have better in fat sensitivity than the conventional aforementioned photosensitive materials. The adhesivity of the photosensitive materials to substrates is also good, and they possess molecular weights. Because of these characteristics, the resin which becomes the printing image after exposure and development, possesses great mechanical strength and therefore increased "printing resistance". Typical example of such photosensitive polymers is a polyether resin which has groups within the polymer of the formula (I):

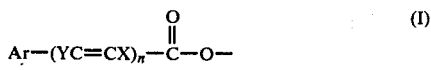

(where X and Y each represents a hydrogen atom, a halogen atom, a cyano group or a nitro group, Ar represents an aryl group which may be substituted, and n represents an integer of 1 to 2.

When this polymer is exposed to the activating light, the carbon-carbon double bond present in the side chain of the polymer molecule undergoes a photo-crosslinking reaction with the carbon-carbon double bond in the side chain of an adjoining polymer molecule to form a four-membered ring, so that the exposed area of the polymer constitutes a cross-linked network of high molecular weight structure. The exposed area of the polymer is therefore less soluble in the developing solvent than the non-exposed polymer area, because the cross-linked area of the exposed polymer is less soluble in the developing solvent that the non-exposed areas. The difference of solubility properties of unexposed polymer versus exposed polymer provides the means of forming the printing plate. In order to prepare a lithographic printing plate with such a photosensitive polymer, the following method is generally employed. First, a solution of the photosensitive polymer in a suitable solvent and additives such as a sensitizer, stabilizer, pigment, or the like is spread over a substrate such as paper, film, cloth, an aluminum plate, a zinc plate or the like which has undergone a suitable surface treatment, to form a uniform coating of the photosensitive polymer on the surface of said substrate thereby forming a printing plate. Then, after drying, a negative is tightly attached to the plate and activating light such as ultraviolet rays is irradiated over the plate, whereby the photosensitive group in the photosensitive polymer of the exposed area of the polymer undergoes a photo-crosslinking reaction to form a network of high molecular weight structure. The plate is then treated with a suitable solvent so that the polymer in the non-exposed area is swollen and dissolved in the solvent and removed from the substrate surface, thereby forming a negative-positive reversed image on the plate. The factor which is most predominant in effecting the printing plate performance is the developing characteristic of the polymeric material. During development, the non-exposed area of the photosensitive polymer is swollen and dissolved by the developing solution and thereby removed. The, the properties of the developing solution are a very important factor in the development of the exposed polymer. Generally, if the composition of the developer is of the type which promotes swelling of the resin to a very high extent, the resin in the exposed area is also affected by the solvent and is slightly swelled during development and therefore becomes slightly tacky. This partial swelling of the exposed polymer makes it very difficult to vividly reproduce the high density portion in the picture, that is, the portion with high dot area ratio, or the minute spaces between complicated patterns. The phenomenon which takes place under these conditions is generally called the "collapse" of the shadow portions of the picture. On the other hand, if the resin swelling and dissolving capacity of the developing solution is too weak, it is impossible to perfectly remove the resin in the non-exposed area from the plate surface, with the result that a residual film remains on the plate surface and hence when printing is conducted later, ink adheres to this area causing "scumming". These facts dictate that it is essential to perfectly remove the resin from the non-exposed area of the film with a developing solution of a composition which has sufficient resin dissolving power and is also capable of confining to a minimum swelling of the resin to minimize the influence of the developing solution on the exposed resin.

SUMMARY OF THE INVENTION

An object of the present invention, is to provide a developer which is capable of developing images from resins while minimizing the swelling of the resin component in the developing solution.

This object is attained by using as a developer for a lithographic sensitive medium of a polyether resin containing groups expressed as shown in formula (I), a solution containing a compound of formula (II):

or formula (III):

wherein R is an alkyl group with a carbon number of 1 to 4, $R^1$ is hydrogen or an acyl group, $R^2$ is an acyl group with a carbon number of 2 to 5, and k is an integer of 2 to 3.

DESCRIPTION OF THE PREFERRED EMBODIMENT

The photosensitive medium for which the developer of this invention is intended consists of polyether resin containing reactive groups of formula (I).

Suitable polyether resins for such a photosensitive medium include, a polymer containing ether bonds in the main chain, such as for example a photosensitive polymer containing repeating units of formula (IV):

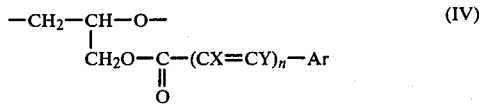

Another suitable photosensitive polymer is one having an ether bond in the side chain, such as for example a photosensitive polymer containing repeating units of formula (V):

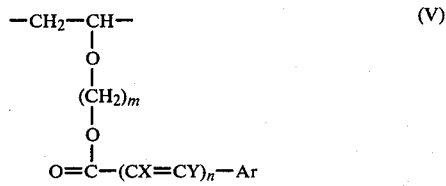

wherein m is an integer of 1 and 2.

Such a photosensitive polymer can be produced with ease, for example by, reacting a halogen-containing polyether resin with a salt of α,β-unsaturated carboxylic acid of formula (VI):

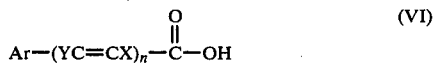

in an aprotic polar solvent.

Suitable examples of the halogen-containing polyether resin satisfactory for this purpose include polymers of epichlorohydrin, epibromohydrin, 1,2-dichloro-3,4-epoxybutane, 1,1-dichloro-2,3-epoxypropane, 2-chloroethylvinylether and the like. It is also possible to use a halogen-containing polyether resin obtained by copolymerizing one of the halogen-containing monomers with ethylene oxide, proprylene oxide, butylene oxide, methylglycidylether or phenylglycidylether. It is also possible to use 3,3-bis (chloromethyl)oxetan, 3,3-bis(bromeomethyl)oxetan and copolymers containing these substances although these materials don't produce a photosensitive polymer containing the repeating shown by formulas (IV) or (V).

The developer of this invention for the types of photosensitive media described is characterized by containing a compound of formula (II) or (III).

Preferred examples of compounds of formula (II), include diethylene glycol monoalkylether such as diethylene glycol monomethylether, diethylene glycol monoethylether and diethylene glycol monobutylether; triethylene glycol monoalkylethers such as triethylene glycol monomethylether, and triethylene glycol monoethylether; diethylene glycol monoalkylether acetates such as diethylene glycol monomethylether acetate, diethylene glycol monoethylether acetate or diethylene glycol monobutylether acetate; and triethylene glycol monoalkylether acetates such as triethylene glycol monomethylether acetate and triethylene glycol monoethylether acetate.

Suitable examples of compounds of formula (III) include ethylene glycol monoalklether acetates such as ethylene glycol monomethylether acetate, ethylene glycol monoethylether acetate and ethylene glycol monobutylether acetate.

The above compounds may be used singly or in combination to prepare the desired developer. In some cases, various kinds of additives can be mixed with the developer.

Suitable additives which can be admixed with the developer compound include cellosolves such as ethylene glycol monopropylether, ethylene glycol monoisopropylether, ethylene glycol monobutylether and ethylene glycol monoisobutylether, which are used to dilute the developer to reduce the dissolving power of the developer; aprotic polar solvents such as N-N'-dimethylformamide, dimethylsulfoxide, N-methylpyrrolidone or hexamethylphosphoramide, which are used to increase the dissolving power of the developer; and water, glycerine, and the like, which are used to prevent the spread of the developer solution to the resin, that is, to improve the wetting and workability while preventing scumming. Other additives which can be suitably used in this invention include hydroxylamine hydrochloride, triethanolamine hydrochloride and suitable kinds of surface active agents. Further, in order to obtain a sharp and clear image, an inorganic acid such as hydrochloric acid, sulfuric acid, phosphoric acid or the like; an organic acid such as lactic acid, acetic acid or the like; or a halogenated acetic acid such as monochloroacetic acid, dichloroacetic acid, trichloroacetic acid, monobromoacetic acid, difluoroacetic acid or the like can be added to the developer solution.

Thus, by using the developer of this invention, the exposed resin can be easily and perfectly developed while minimizing swelling of the photosensitive medium. Thus, images of very excellent characteristics can be obtained.

Having generally described the invention, a more complete understanding can be obtained by reference to certain specific examples, which are provided herein for purposes of illustration only and are not intended to be limiting unless otherwise specified.

EXAMPLE 1

A cinnamic acid type photosensitive resin (hereinafter referred to as CIEP) expressed by the following formula:

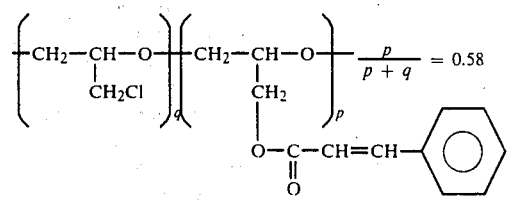

was dissolved in 4-methyl-4-methoxy-2-pentanone to prepare a 4.9 wt % solution. A sensitizer of 5-nitroace naphthene was added thereto in an amount of 1 mole % based on CIEP (repeating unit), followed by further addition of Phthalocyanine Blue as a coloring agent in an amount of 1 wt % based on the photosensitive solution. The mixture, after agitation, was subjected to ultrasonic dispersion to obtain a colored photosensitive solution. This photosensitive solution was applied, by using a whirler rotated at 70 rpm, on an aluminum plate which had undergone an electrolytic etching treatment and then an anodizing treatment, thereby preparing a printing plate. The amount of the solution applied was about 1.3 g/m². After drying the plate for one day at room temperature, a lith film negative was attached to the plate, the latter being then being inserted in a printer and subjected to 40-second exposure at a distance of 50 cm from a high-pressure mercury vapor lamp (Unipulse, mfd. by Ushio Electics) used as light source under vacuum. After exposure, diethylene glycol monoethylether was dropped onto the plate and spread over the plate surface, which was then rubbed gently by a pad, whereby the resin in the non-exposed area was easily removed and the desired development was accomplished. The obtained plate could produce distinct picture with excellent dot reproducibility and good removability of the non-image area. This plate, after washing with water, was desensitized with an aqueous solution of gum arabic (rubber solution with 14° Be) and then subjected to actual printing in an offset printing press. By this procedure highquality prints with excellent ink adhesion and no scumming was obtained.

EXAMPLE 2

Development was of a exposed resin conducted in the manner of Example 1 using a developer of the following composition instead of diethylene glycol monoethylether.

| | |
|---|---|
| Diethylene glycol monoethylether | 37.0 (wt %) |
| Ethylene glycol monobutylether | 58.7 (wt %) |
| Hydroxylamine hydrochloride | 1.1 (wt %) |
| 98% sulfuric acid | 1.1 (wt %) |
| Water | 2.1 (wt.%) |

The obtained plate developed a clear image and had better tone reproducibility than the plate obtained Example 1.

COMPARATIVE EXAMPLE 1

Development of an exposed resin was conducted in the same manner of Example 1 except that xylene which is a well known developer, was used instead of diethylene glycol monoethylether. Although this solution could develop a picture, the tone reproducibility was poor because of excessive swelling of the resin in the image area. Also, since resin in the non-exposed area was not unremoved, the non-image area had a trace of color and showed excessive water repellency. After washing with water and desensitizing, the plate was used for printing by an offset printing press, but ink soon adhered to and soiled the non-image area on the plate, making it impossible to continue printing.

REFERENCE EXAMPLE 1

For the sake of comparing the results of Example 1 and the results of Comparative Example 1, examinations were conducted on the effect of removing non-exposed resin in the non-image area as well as the tone reproducibility of the printing plate obtained by closely attaching a lith film of halftone negative with a dot area ratio of 43.1% to a plate prepared in the same way as Example 1, then exposing it in a way similar to the procedure of Example 1 and then subjecting it to a developing treatment with diethylene glycol monoethylether. A printing plate was obtained by similarly attaching a lith film of a halftone negative with a dot area ratio of 43.1%, and then exposing and subjecting the plate to a developing treatment with xylene in the same way as Comparative Example 1. The results are shown in Table 1 below. These results attest to the fact that diethylene glycol monoethylether provides better tone reproducibility and effects better removal of non-image area resin than obtainable with xylene.

TABLE 1

| Developer | Non-picture area reflection density | Dot area ratio |
|---|---|---|
| Diethylene glycol monoethylether | 0.20 | 46.4% |
| Xylene | 0.38 (Aluminum base = 0.15) | 57.5% (Original = 43.1) |

COMPARATIVE EXAMPLE 2

A printing plate was prepared in the manner of Example 1, and after exposure, the plate was subjected to development with cyclohexanone. As a result, although an image was developed, the color density of the image area was low and the non-image area had excessive water repellency. After washing with water and a gumming treatment, the plate was subjected to printing by an offset printing press. However, ink adhered to and soiled the non-image area on the plate immediately after start of the printing operation, making it impossible to continue printing.

COMPARATIVE EXAMPLE 3

Development was conducted in the manner of Comparative Example 2 except that monochlorobenzene was used as the developer. Although an image developed, the color density of the image area was low and the non-image area showed excessive water repellency. When the plate was used in a printing operation in an offset printing press after water-washing and gumming, ink adhesion and soiling took place immediately as in the case of Comparative Example 2 making it impossible to continue printing.

COMPARATIVE EXAMPLE 4

Development was conducted after the fashion of Comparative Example 2 using N,N'-dimethylformamide, with the result that the color density of the image area was lowered excessively and image reproduction was difficult.

REFERENCE EXAMPLE 2

To evaluate the results of Comparative Examples 2 to 4, the effect of removing non-exposed resin in the non-image area the dot reproducibility of the printing plates obtained by attaching a lith film of halftone negative with dot area ratio of 43.1% to the plates, then exposing and developing the plates in a treatment by using cyclohexane, monochlorobenzene and N,N'-dimethylformamide respectively, in the same way as Comparative Example 1 was examined. The results are shown in Table 2. From these results, it would seen that cyclohexane, monochlorobenzene and N,N'-dimethylformamide have a better effect of removing the non-image resin than diethylene glycol monoethylether, but as already mentioned in connection with Comparative Examples 2 and 3, the non-image area shows excessive water repellency and also when these plates are actually used for printing, ink deposits soil the non-image area, making it impossible to continue printing. It is therefore considered that, because of the strong resin swelling activity of these solvents, resin is swollen during development and forcibly coated on the aluminum surface by the pad. On the other hand, since N,N'-dimethylformamide has an even greater resin swelling action and solubility than cyclohexanone or monochlorobenzene, it is believed that this solvent affects the image area resin which was exposed to form a high molecular weight photo-crosslinking net structure.

TABLE 2

|  | Non-picture portion reflection density | Dot area ratio |
|---|---|---|
| Cyclohexanone | 0.16 | 49.4% |
| Monochlorobenzene | 0.18 | 47.8% |
| N,N'-dimethylformamide | 0.16 | Unable to reproduce picture |
|  | Aluminum base = 0.15 | Original = 43.1% |

EXAMPLE 3

A lith film negative was attached to a printing plate prepared in the same way as described in Example 1. The plate was, then inserted in a printer and subjected to a 40-second exposure at a distance of 50 cm from a high-pressure mercury vapor lamp (Unipulse, mfd. by Ushio Electrics) used as light source under vacuume. After exposure, ethylene glycol monomethylether acetate was dropped onto the plate and spread over the plate surface, and then gently rubbed with pad, wereby the resin in the non-exposed area was easily removed to achieve the desired development. The obtained plate produced distinct images with excellent dot reproducibility and good removability of the non-image area. After washing with water, the plate was gummed and used for printing in an offset printing press, whereby clear prints free of blots were obtained.

EXAMPLE 4

Polyvinyloxyethy; cinnamate of the following formula:

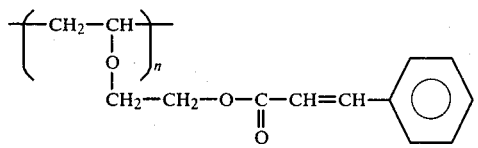

was dissolved in a 12.7 wt % solution of ethyl cellosolve acetate, and then 4-nitro-N-acetyl-α-napthylamine as a sensitizer was added thereto in an amount of 10.3 wt % based on the polymer to prepare a photosensitive solution. The photosensitive solution was applied, by using a whirler rotated at 70 rpm, on an aluminum plate which was subjected to an electrolytic etching and then was anodized, thereby preparing a printing plate. After drying at room temperature for one day, a lith film negative was attached to the plate. The plate was then inserted into a printer and subjected to 2-minute exposure at a distance of 50 cm from the light source, a high-pressure mercury vapor lamp (Unipulse, mfd. by Ushio Electrics), under vacuum. After exposure, diethylene glycol monoethylether was dropped onto the plate and spread on the plate surface, followed by gentle rubbing with a pad, whereby the resin in the non-exposed area was easily removed and a distinct image with good removability of the non-image area was obtained.

EXAMPLE 5

A printing plate was prepared after the manner of Example 3, and after exposure, it was developed with ethylene glycol monoethylether acetate. As a result, the resin in the non-exposed portion was easily removed and a distinct image was obtained with good removability of the non-image area.

What is claimed is:

1. A method for developing the exposed image of a lithographic photosensitive polymer containing repeating units of the formula:

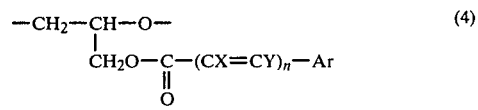

or the formula:

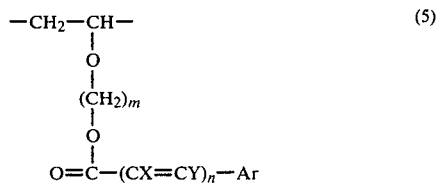

wherein X and Y represent hydrogen, halogen, cyano or nitro; Ar represents an aryl group which can be substituted and m and n each represent an integer of 1 to 2, which comprises:

treating said exposed lithographic photosensitive medium with a developer consisting essentially of an image developable amount of a compound of the formula:

or

wherein R represents an alkyl groups with a carbon number of 1 to 4, $R^1$ represents hydrogen or an acyl group, $R^2$ represents an acyl group with a carbon number of 2 to 5, and k represents an integer of 2 to 3, for a time sufficient to dissolve and remove only the unexposed portions of said photosensitive medium.

2. The method of claim 1, wherein said compound is a diethyleneglycol monoalkylether, a triethyleneglycolmonoalkylether, a diethyleneglycol monoalkylether acetate, or a triethyleneglycolmonoalkylether acetate.

3. The method of claim 1, wherein said compound is diethyleneglycolmonoethylether or ethyleneglycolmonomethylether acetate.

4. The method of claim 1, wherein said developer further consists of an image developable amount of an inorganic acid, and organic acid or a substituted halogenacetic acid.

5. The method of claim 4, wherein said inorganic acid is hydrochloric acid or sulfuric acid; said organic acid is acetic acid and said halogenacetic acid is monochloroacetic acid, dichloroacetic acid, trichloroacetic acid, monobromoacetic acid or difluoroacetic acid.

6. The method of claim 1, wherein said developer further consists of water, glycerine, hydroxylamine hydrochloride or triethanolamine hydrochloride.

* * * * *